United States Patent
Lee

(10) Patent No.: US 9,894,770 B2
(45) Date of Patent: Feb. 13, 2018

(54) EMBEDDED ELECTRONIC COMPONENT AND METHOD OF MANUFACTURING ELECTRONIC COMPONENT EMBEDDED SUBSTRATE

(71) Applicant: SAMSUNG ELECTRO-MECHANICS CO., LTD., Suwon (KR)

(72) Inventor: Doo Hwan Lee, Daejeon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 317 days.

(21) Appl. No.: 14/453,953

(22) Filed: Aug. 7, 2014

(65) Prior Publication Data

US 2015/0049446 A1    Feb. 19, 2015

(30) Foreign Application Priority Data

Aug. 14, 2013 (KR) .......... 10-2013-0096652

(51) Int. Cl.
*H05K 1/18* (2006.01)
*H05K 7/10* (2006.01)
(Continued)

(52) U.S. Cl.
CPC .......... *H05K 1/185* (2013.01); *H01L 21/568* (2013.01); *H01L 2224/04105* (2013.01);
(Continued)

(58) Field of Classification Search
CPC .......... H05K 1/185; H05K 2201/10; H05K 2201/10022; H05K 2201/1003; H05K 1/162; H05K 1/165; H05K 1/167
(Continued)

(56) References Cited

U.S. PATENT DOCUMENTS

2003/0162386 A1* 8/2003 Ogawa ............... H01L 21/4846
                                                          438/637
2009/0242252 A1* 10/2009 Tanaka ............... H01L 23/5389
                                                          174/260
(Continued)

FOREIGN PATENT DOCUMENTS

| KR | 10-2000-0053501 | 8/2000 |
|---|---|---|
| KR | 10-0832653 | 5/2008 |
| KR | 10-2012-0000803 | 1/2012 |

OTHER PUBLICATIONS

Korean Office Action dated Jun. 25, 2014 in corresponding Korean Patent Application No. 10-2013-0096652.

*Primary Examiner* — Binh Tran
(74) *Attorney, Agent, or Firm* — NSIP Law

(57) ABSTRACT

Disclosed is an embedded electronic component which can improve reliability of connection with external wiring and efficiency of an embedding process by including: a contact pad provided on at least one surface of a body portion and made of a conductive material; a first insulating layer for covering the at least one surface of the body portion; a first pad in contact with a surface of the contact pad and made of a conductive material; a rearrangement portion provided on a surface of the first insulating layer to be in contact with the first pad; a second pad provided on the surface of the first insulating layer to be in contact with the rearrangement portion; and a second insulating layer having an opening to expose a portion of the second pad while covering the first insulating layer, the first pad, the rearrangement portion, and the second pad.

5 Claims, 3 Drawing Sheets

(51) Int. Cl.

| | | |
|---|---|---|
| H05K 7/12 | (2006.01) | |
| H01R 9/00 | (2006.01) | |
| H05K 1/16 | (2006.01) | |
| H05K 1/11 | (2006.01) | |
| H05K 3/40 | (2006.01) | |
| H01L 21/56 | (2006.01) | |

(52) U.S. Cl.
CPC .............. *H05K 1/114* (2013.01); *H05K 1/162* (2013.01); *H05K 1/165* (2013.01); *H05K 1/167* (2013.01); *H05K 3/4007* (2013.01); *H05K 2201/10* (2013.01); *H05K 2201/1003* (2013.01); *H05K 2201/10022* (2013.01); *Y10T 29/49146* (2015.01)

(58) Field of Classification Search
USPC ....... 361/761, 763, 764, 766, 767, 772, 773, 361/774
See application file for complete search history.

(56) References Cited

U.S. PATENT DOCUMENTS

2009/0263939 A1  10/2009  Sakamoto et al.
2010/0300738 A1* 12/2010  Ito .................... H01L 23/49827
                                                              174/260

* cited by examiner

[FIG. 1]
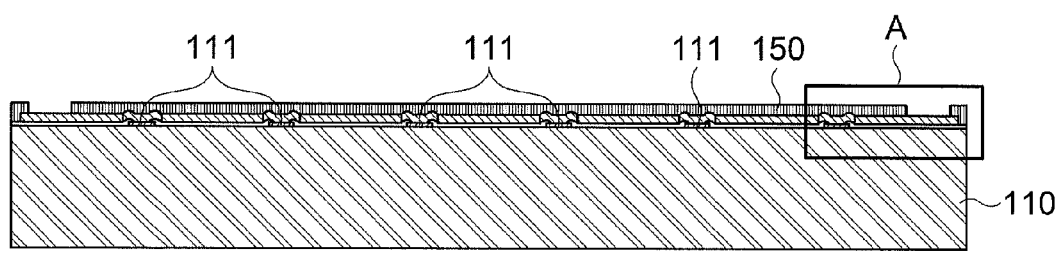
[FIG. 2]
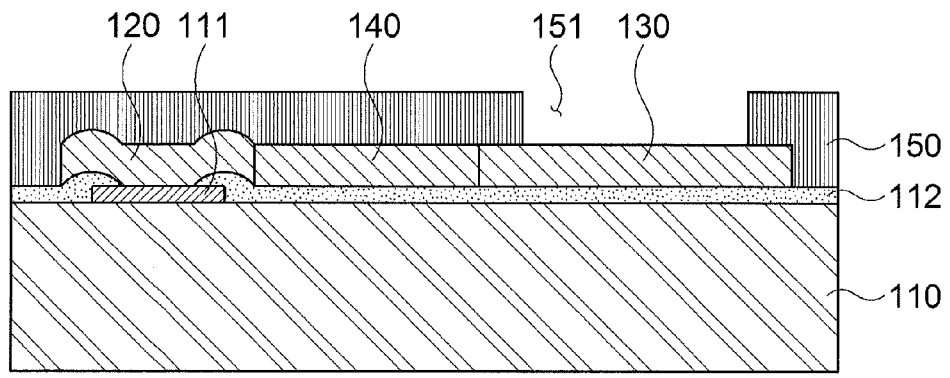

[FIG. 3]
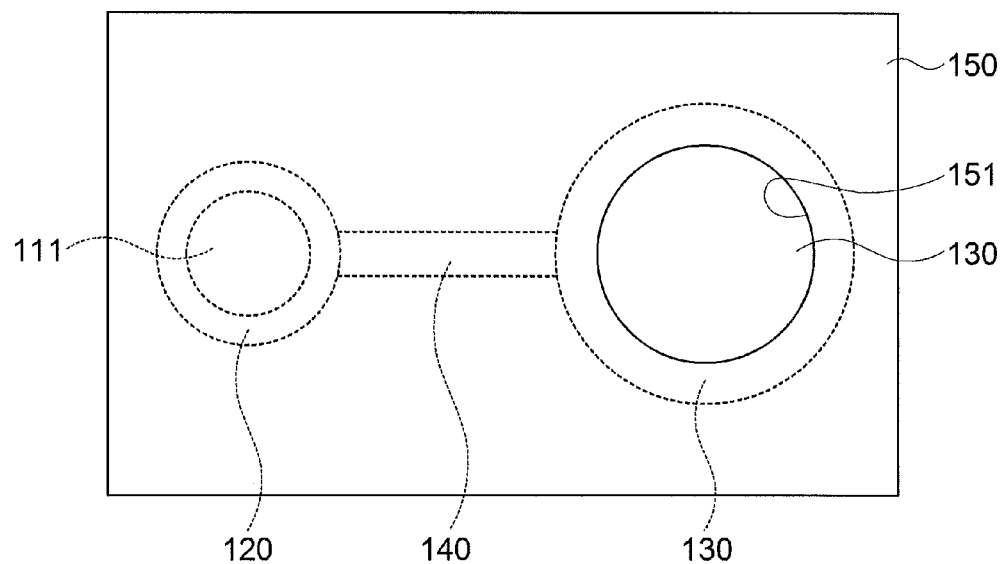
[FIG. 4A]
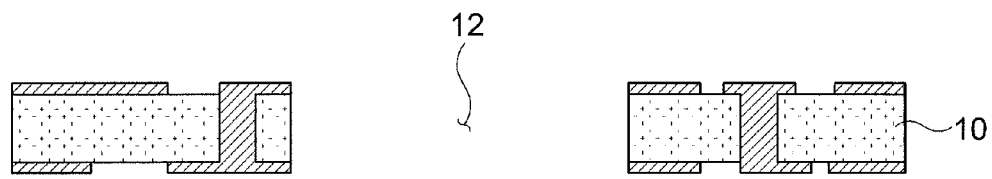
[FIG. 4B]
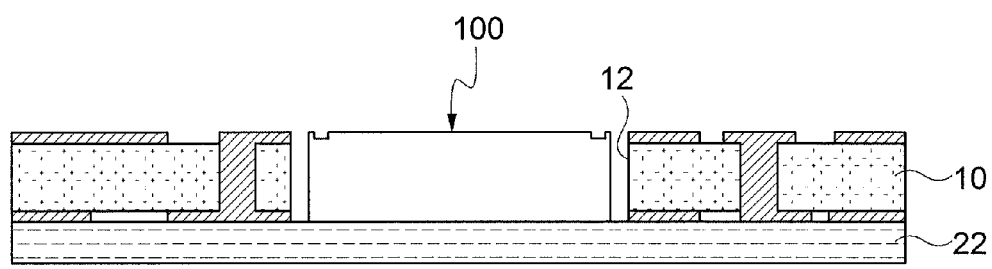

[FIG. 4C]
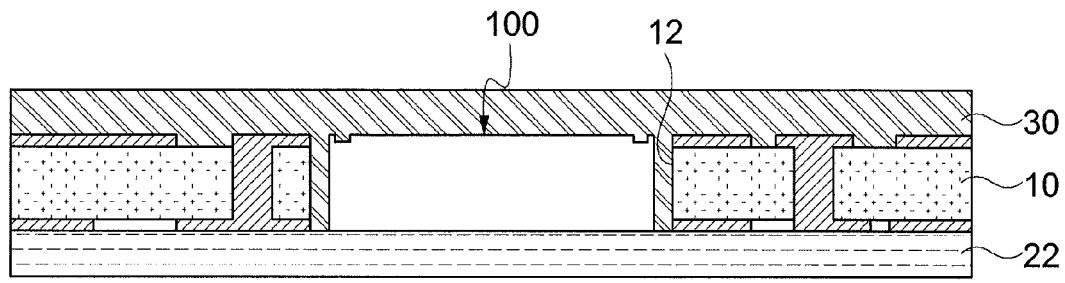
[FIG. 4D]
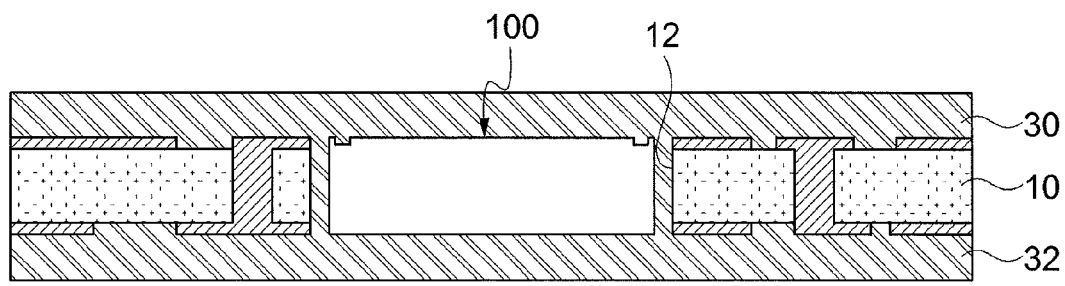
[FIG. 4E]
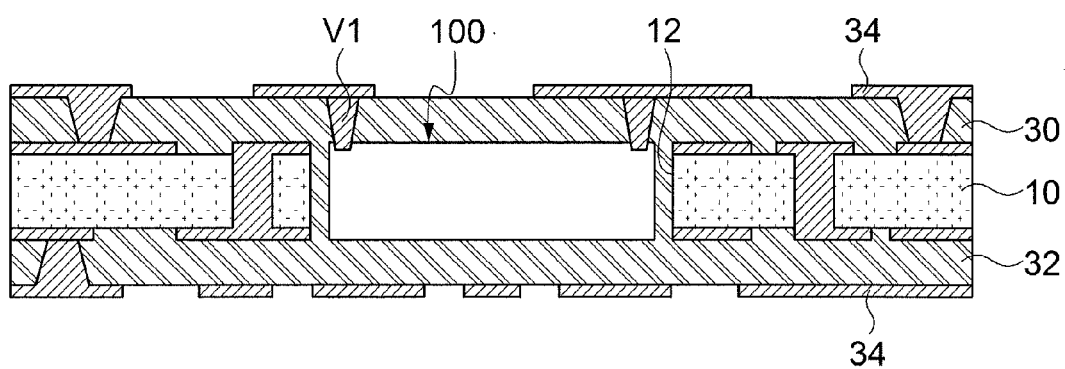

EMBEDDED ELECTRONIC COMPONENT AND METHOD OF MANUFACTURING ELECTRONIC COMPONENT EMBEDDED SUBSTRATE

CROSS-REFERENCE TO RELATED APPLICATIONS

This application claims the foreign priority benefit of Korean Patent Application Serial No. 10-2013-0096652 filed Aug. 14, 2013, which is hereby incorporated by reference in its entirety into this application.

BACKGROUND OF THE INVENTION

1. Field of the Invention

The present invention relates to an embedded electronic component and a method of manufacturing an electronic component embedded substrate.

2. Description of the Related Art

Even though various electronic components such as passive elements and active elements are continuously becoming smaller, the functions of the electronic components are being further improved. Further, there are continuous efforts to make electronic devices slim by embedding the electronic components in substrates.

Meanwhile, as the function and performance of the active elements such as IC chips are improved, the number of contact pads for electrically connecting external wiring and the inside of the active element are also increased.

Further, the thickness and area of the active element itself are continuously becoming smaller.

Accordingly, since the area of the contact pad itself should be reduced and the interval between the contact pads also should be reduced, a process of electrically connecting the contact pads of the active element to an external device is becoming more difficult.

In addition, when the electronic component is embedded in the substrate, a via, which passes through an insulating layer, should be electrically connected to the contact pad, but as the area of the contact pad itself and the interval between the contact pads are reduced, there is a great reduction in the connection reliability in a process of forming a via-hole or in a process of plating a via by plating.

SUMMARY OF THE INVENTION

The present invention has been invented in order to overcome the above-described problems and it is, therefore, an object of the present invention to provide an embedded electronic component, which can improve reliability of connection with external wiring and efficiency of an embedding process, and a method of manufacturing an electronic component embedded substrate.

In accordance with one aspect of the present invention to achieve the object, there is provided an embedded electronic component, which includes: a contact pad provided on at least one surface of a body portion and made of a conductive material; a first insulating layer for covering the at least one surface of the body portion; a first pad in contact with a surface of the contact pad and made of a conductive material; a rearrangement portion provided on a surface of the first insulating layer and made of a conductive material to be in contact with the first pad; a second pad provided on the surface of the first insulating layer and made of a conductive material to be in contact with the rearrangement portion; and a second insulating layer having an opening to expose a portion of the second pad while covering the first insulating layer, the first pad, the rearrangement portion, and the second pad.

At this time, the rearrangement portion may be in contact with a side surface, which is vertical to a contact surface between the first pad and the contact pad, among the side surfaces of the first pad.

Further, the rearrangement portion may be in contact with a side surface, which is vertical to a contact surface between the second pad and the first insulating layer, among the side surfaces of the second pad.

Further, the first insulating layer may be a passivation layer.

Further, the first insulating layer may cover a portion of one surface of the contact pad, which is opposite to a contact surface between the contact pad and the embedded electronic component.

Further, the second insulating layer may be made of at least one material selected from polyimide, BCB, $Si_3N_4$, $SiO_2$, BPSG, and PSG.

Further, the area of one surface of the second pad, which is opposite to the contact surface between the second pad and the first insulating layer, may be larger than the area of one surface of the contact pad, which is opposite to a contact surface between the contact pad and the body portion.

Further, the area of the one surface of the second pad, which is exposed by the opening, may be larger than the area of the one surface of the contact pad, which is opposite to the contact surface between the contact pad and the body portion.

In accordance with another aspect of the present invention to achieve the object, there is provided a method of manufacturing an electronic component embedded substrate, which includes the steps of: inserting an embedded electronic component in a first insulating portion with a cavity; forming a second insulating portion and a third insulating portion to cover the first insulating portion and the embedded electronic component; and forming a via passing through at least one of the second insulating portion and the third insulating portion and a conductive pattern electrically connected to the via, wherein at least one of the vias may be in contact with the second pad.

At this time, a rearrangement portion may be in contact with a side surface, which is vertical to a contact surface between a first pad and a contact pad, among the side surfaces of the first pad and a side surface, which is vertical to a contact surface between the second pad and a first insulating layer, among the side surfaces of a second pad.

Further, the area of one surface of the second pad, which is exposed by an opening, may be larger than the area of one surface of the contact pad, which is opposite to a contact surface between the contact pad and a body portion.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view schematically showing an embedded electronic component in accordance with an embodiment of the present invention;

FIG. 2 is an enlarged cross-sectional view schematically showing a portion A of FIG. 1;

FIG. 3 is an enlarged plan view schematically showing the portion A of FIG. 1; and FIGS. 4A to 4E are process cross-sectional views schematically showing a method of manufacturing an electronic component embedded substrate in accordance with an embodiment of the present invention, wherein FIG. 4A is a cross-sectional view schematically showing a first insulating portion with a cavity in accordance with an embodiment of the present invention, FIG. 4B is a cross-sectional view schematically showing the state in which an embedded electronic component is inserted in the cavity in accordance with an embodiment of the present invention, FIG. 4C is a cross-sectional view schematically showing the state in which a second insulating portion is formed in accordance with an embodiment of the present invention, FIG. 4D is a cross-sectional view schematically showing the state in which a third insulating portion is formed in accordance with an embodiment of the present invention, and FIG. 4E is a cross-sectional view schematically showing the state in which a via and a conductive pattern are formed in accordance with an embodiment of the present invention.

DETAILED DESCRIPTION OF THE PREFERABLE EMBODIMENTS

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Hereinafter, configurations and operational effects of the present invention will be described in detail with reference to the accompanying drawings.

FIG. 1 is a cross-sectional view schematically showing an embedded electronic component 100 in accordance with an embodiment of the present invention, FIG. 2 is an enlarged cross-sectional view schematically showing a portion A of FIG. 1, and FIG. 3 is an enlarged plan view schematically showing the portion A of FIG. 1.

Referring to FIGS. 1 to 3, the embedded electronic component 100 according to an embodiment of the present invention may include a body portion 110, a contact pad 111, a first insulating layer 112, a first pad 120, a rearrangement portion 140, a second pad 130, and a second insulating layer 150.

The contact pad 111 may be provided on an outer surface of the body portion 110, and as shown in FIG. 1, may be provided on the outer surface of the body portion in plural. At this time, the area of each contact pad 111 and the interval between the contact pads 111 may be decreased according to the trend toward high function and miniaturization of the electronic components.

Meanwhile, the first insulating layer 112 may be formed on the outer surface of the body portion 110 to protect the body portion 110 and stabilize the characteristics of the body portion 110.

In this point of view, when the electronic component is a semiconductor device, the first insulating layer 112 may function as a passivation layer.

When foreign materials penetrate a surface or a junction portion of the semiconductor device, the interface state of the semiconductor device is changed to cause an increase in leakage current, a variation in current amplification factor, a change in threshold, etc. In order to this, the passivation layer is provided on the surface of most of the semiconductor devices.

However, this first insulating layer 112 may form a step while covering a portion of an upper surface of the contact pad 111 in a passivation process.

Accordingly, a dimple may be formed when forming a via or wiring for electrically connecting the contact pad 111 and external wiring, thus deteriorating contact reliability.

In order to overcome this problem, in the embedded electronic component 100 according to an embodiment of the present invention, the first pad 120 in contact with the upper surface of the contact pad 111, the rearrangement portion 140 connected to the first pad 120, and the second pad 130 connected to the rearrangement portion 140 are provided.

That is, the contact reliability can be improved not by directly connecting the external wiring to the contact pad 111 but by connecting the external wiring to the second pad 130 which is electrically connected to the contact pad 111 through the first pad 120 and the rearrangement portion 140.

Further, as described above, when a portion of the first insulating layer 112 covers the upper surface of the contact pad 111, an outer peripheral portion of the first pad 120 in contact with the upper surface of the contact pad 111 also may have a convexly projecting shape, for example, a mushroom shape. Therefore, since an upper surface of the second pad 130 can be implemented more flat than that of the first pad 120, it is advantageous in terms of the improvement of the contact reliability to connect the via to the second pad 130 rather than directly connect the via to the first pad 120.

Here, the first insulating layer 112, the first pad 120, the rearrangement portion 140, and the second pad 130 may be covered with the second insulating layer 150. However, an opening 151 may be formed in the second insulating layer 150 to expose a portion of the upper surface of the second pad 130.

Further, the second insulating layer 150 may be made of at least one material selected from polyimide, BCB, $Si_3N_4$, $SiO_2$, BPSG, and PSG. In order to improve the contact reliability, a lower modulus is preferable, and in such a point of view, polyimide is most preferred.

Meanwhile, as shown in FIGS. 2 and 3, the second pad 130 may have a larger area than the contact pad 111. Particularly, the exposed surface of the second pad 130 by the opening 151 may have a larger area than the contact pad 111.

Accordingly, it is possible to improve the efficiency of a process of connecting the contact pad 111 and the external wiring after embedding the embedded electronic component 100 according to an embodiment of the present invention in a substrate and improve the connection reliability between the electronic component and the external wiring.

That is, in the prior art, the vias, which are respectively in direct contact with the contact pads 111 having small area and pitch, should be formed, but in the embedded electronic component 100 according to an embodiment of the present invention, it is only needed to form the via in contact with the second pad 130 having a large area instead of the contact pad 111 having a small area, thereby improving the process efficiency and the connection reliability.

In addition, there is a great risk of damage to the body portion 110 itself due to the small area of the contact pad 111 in a process of forming a via hole for the via connected to the contact pad 111, but in the embedded electronic component 100 according to an embodiment of the present invention, the risk of damage to the body portion 110 itself can be greatly reduced by forming the via on the second pad 130 having a relatively large area.

Meanwhile, the rearrangement portion 140 may be in contact with a side surface of the first pad 120 and a side surface of the second pad 130.

That is, the rearrangement portion 140 may be in contact with the side surface, which is vertical to a contact surface of the first pad 120 and the contact pad 111, among the side surfaces of the first pad 120, and in contact with the side surface, which is vertical to a contact surface of the second pad 130 and the first insulating layer 112, among the side surfaces of the second pad 130.

Accordingly, it is possible to minimize the increase in thickness of the embedded electronic component 100 due to the implementation of a rearrangement structure connected to the contact pad 111.

FIGS. 4A to 4E are process cross-sectional views schematically showing a method of manufacturing an electronic component embedded substrate in accordance with an embodiment of the present invention, wherein FIG. 4A is a cross-sectional view schematically showing a first insulating portion 10 with a cavity 12 in accordance with an embodiment of the present invention, FIG. 4B is a cross-sectional view schematically showing the state in which an embedded electronic component 100 is inserted in the cavity 12 in accordance with an embodiment of the present invention, FIG. 4C is a cross-sectional view schematically showing the state in which a second insulating portion 30 is formed in accordance with an embodiment of the present invention, FIG. 4D is a cross-sectional view schematically showing the state in which a third insulating portion 32 is formed in accordance with an embodiment of the present invention, and FIG. 4E is a cross-sectional view schematically showing the state in which a via and a conductive pattern 34 are formed in accordance with an embodiment of the present invention.

Referring to FIGS. 4A to 4E, the method of manufacturing an electronic component embedded substrate according to an embodiment of the present invention may form the second insulating portion 30 and the third insulating portion 32 after inserting the above-described embedded electronic component 100 in the cavity 12 provided in the first insulating portion 10 and form vias passing through the second insulating portion 30 or the third insulating portion 32 and conductive patterns of an outer surface. At this time, at least one via V1 of the vias may be in contact with a second pad 130 of the embedded electronic component 100.

Here, a fixing member 22 such as an adhesive tape may be used to fix the position of the embedded electronic component 100 and the first insulating portion 10.

That is, in a state in which the fixing member 22 is attached to a lower surface of the first insulating portion 10, the embedded electronic component 100 may be inserted in the cavity 12 provided in the first insulating portion 10 to attach the bottom of the embedded electronic component 100 to the fixing member 22.

Further, in this state, after the second insulating portion 30 is formed to fix the embedded electronic component 100, the fixing member 22 may be removed and the third insulating portion 32 may be formed.

Accordingly, compared to the conventional method of directly connecting the via to the contact pad 111 or a metal electrode provided on a surface of the contact pad 111, it is possible to improve the efficiency of a via forming process and the connection reliability between the via and the electronic component and greatly reduce the risk of damage to the electronic component in the via forming process.

The embedded electronic component according to an embodiment of the present invention configured as above provides a useful effect of improving the contact reliability not by directly connecting the external wiring to the contact pad but by connecting the external wiring to the second pad which is electrically connected to the contact pad through the first pad and the rearrangement portion.

Further, in the prior art, the vias, which are respectively in direct contact with the contact pads having small area and pitch, should be formed, but in the embedded electronic component according to an embodiment of the present invention, it is only needed to form the via in contact with the second pad having a large area instead of the contact pad having a small area, thereby improving the process efficiency and the connection reliability.

Further, there is a great risk of damage to the body portion itself due to the small area of the contact pad in the process of forming the via hole for the via connected to the contact pad, but in the embedded electronic component according to an embodiment of the present invention, the risk of damage to the body portion itself can be greatly reduced by forming the via on the second pad having a relatively large area.

Further, it is possible to minimize the increase in thickness of the embedded electronic component due to the implementation of the rearrangement structure connected to the contact pad by making the rearrangement portion in contact with the side surface of the first pad and the side surface of the second pad.

Further, the method of manufacturing an electronic component embedded substrate according to an embodiment of the present invention provides useful effects of improving the efficiency of the via forming process and the connection reliability between the via and the electronic component and greatly reducing the risk of damage to the electronic component in the via forming process compared to the conventional method of directly connecting the via to the contact pad or the metal electrode provided on the surface of the contact pad.

What is claimed is:

1. An embedded electronic component, comprising:
    a body portion having a contact pad formed thereon;
    a passivation layer formed on a surface of the body portion and exposing a portion of the contact pad;
    a first pad formed on the passivation layer and connected with the contact pad;
    a rearrangement portion formed on the passivation layer and connected to a lateral surface of the first pad;
    a second pad formed on the passivation layer and connected to a lateral surface of the rearrangement portion; and
    an insulating layer covering the passivation layer, the first pad, the rearrangement portion and the second pad and exposing a portion of the second pad,
    wherein the first pad is spaced apart from the second pad, and
    wherein an upper surface of the first pad is convexly protruded and the protruded surface is higher than an upper surface of the second pad.

2. The embedded electronic component according to claim 1, wherein the passivation layer covers a portion of one surface of the contact pad.

3. The embedded electronic component according to claim 1, wherein the insulating layer is made of at least one material selected from polyimide, BCB, $Si_3N_4$, $SiO_2$, BPSG, and PSG.

4. The embedded electronic component according to claim 1, wherein the area of the second pad is larger than the area of the contact pad.

5. The embedded electronic component according to claim 4, wherein the area of the second pad exposed by the insulating layer is larger than the area of the contact pad.

* * * * *